(12) United States Patent
Tsujino et al.

(10) Patent No.: US 11,768,261 B2
(45) Date of Patent: Sep. 26, 2023

(54) MAGNETIC RESONANCE IMAGING SYSTEM, MAGNETIC RESONANCE IMAGING APPARATUS, COOLING CONTROL DEVICE, AND COOLING CONTROL METHOD

(71) Applicant: Canon Medical Systems Corporation, Otawara (JP)

(72) Inventors: Hiroyuki Tsujino, Nasushiobara (JP); Kazuto Nakabayashi, Nasushiobara (JP)

(73) Assignee: Canon Medical Systems Corporation, Otawara (JP)

( * ) Notice: Subject to any disclaimer, the term of this patent is extended or adjusted under 35 U.S.C. 154(b) by 0 days.

(21) Appl. No.: 17/661,423

(22) Filed: Apr. 29, 2022

(65) Prior Publication Data

US 2022/0381857 A1 Dec. 1, 2022

(30) Foreign Application Priority Data

May 26, 2021 (JP) .................................. 2021-088649

(51) Int. Cl.
*G01R 33/34* (2006.01)
*G01R 33/3815* (2006.01)

(52) U.S. Cl.
CPC ... *G01R 33/3403* (2013.01); *G01R 33/34023* (2013.01); *G01R 33/3815* (2013.01)

(58) Field of Classification Search
CPC .............. G01R 33/543; G01R 33/5608; G01R 33/4828; G01R 33/3415; G01R 33/283; G01R 33/307; G01R 33/60; G01R 33/3403; G01R 33/34023; G01R 33/3815; G01V 3/32; E21B 49/08; E21B 2049/085; G01N 24/10
See application file for complete search history.

(56) References Cited

U.S. PATENT DOCUMENTS

| 10,739,426 B2 | 8/2020 | Ham et al. | |
| 2010/0231215 A1* | 9/2010 | Ma ..................... | G01R 33/3804 324/318 |
| 2011/0210739 A1* | 9/2011 | Ham ................... | G01R 33/3852 324/318 |

(Continued)

FOREIGN PATENT DOCUMENTS

| JP | 2007-48973 A | 2/2007 |
| JP | 2011-202862 A | 10/2011 |

(Continued)

*Primary Examiner* — Jermele M Hollington
*Assistant Examiner* — Taqi R Nasir
(74) *Attorney, Agent, or Firm* — Oblon, McClelland, Maier & Neustadt, L.L.P.

(57) ABSTRACT

According to one embodiment, a magnetic resonance imaging system includes a first imaging apparatus, a first cooling system, a second imaging apparatus, a second cooling system and a cooling control device. The first imaging apparatus includes a first magnet configured to generate a static magnetic field. The first cooling system is configured to cool the first magnet. The second imaging apparatus includes a second magnet configured to generate a static magnetic field. The second cooling system is configured to cool the second magnet. The cooling control device is configured to switch a cooling target of each of the first cooling system and the second cooling system.

18 Claims, 9 Drawing Sheets

(56) References Cited

U.S. PATENT DOCUMENTS

2019/0003743 A1* 1/2019 Pfleiderer ................. H01F 6/04
2019/0310333 A1* 10/2019 Ham .................. G01R 33/3403

FOREIGN PATENT DOCUMENTS

| JP | 2015-27549 A | 2/2015 |
| JP | 2019-506923 A | 3/2019 |
| JP | 2019-520910 A | 7/2019 |
| WO | WO 2017/114866 A1 | 7/2017 |

* cited by examiner

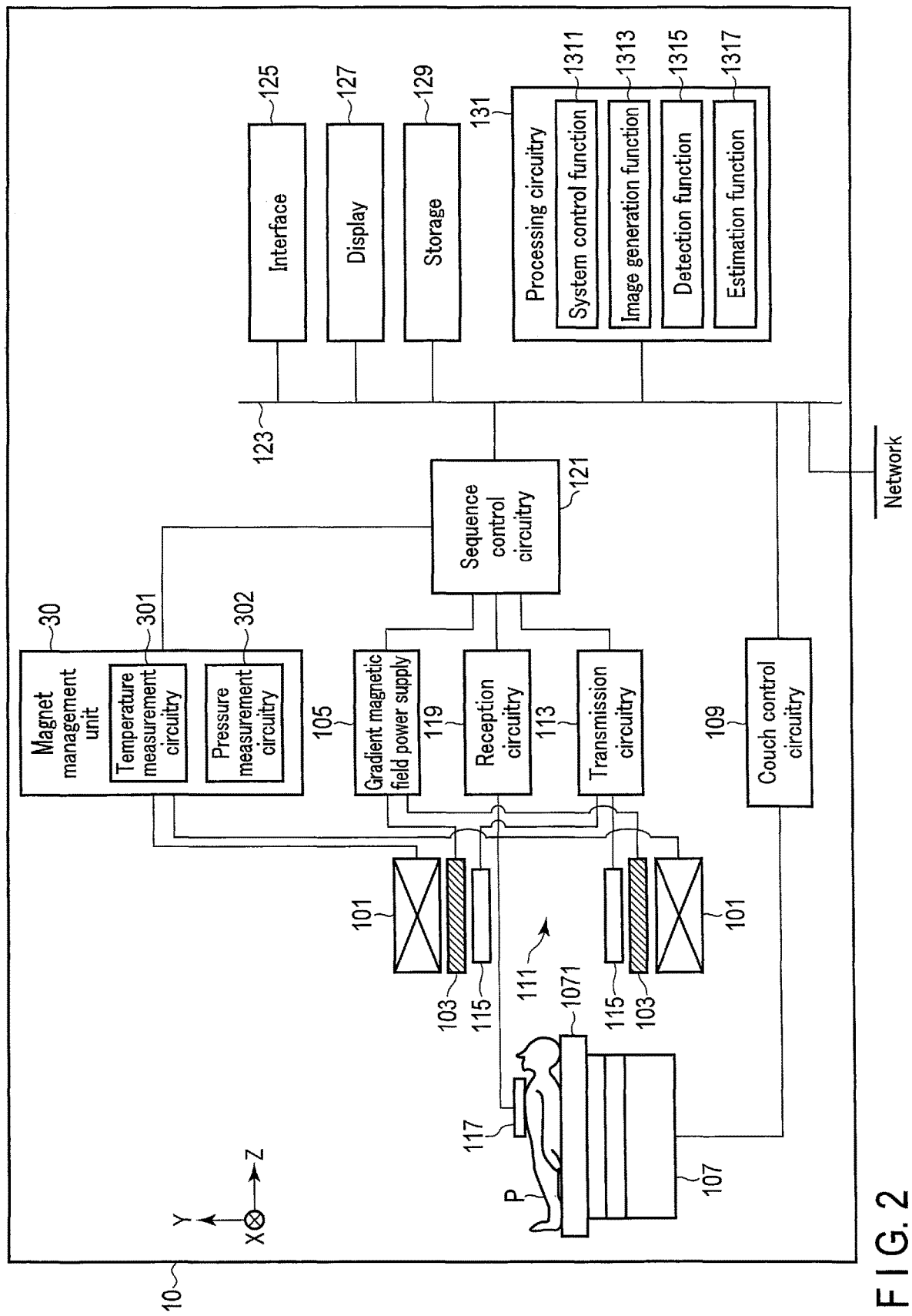
F I G. 2

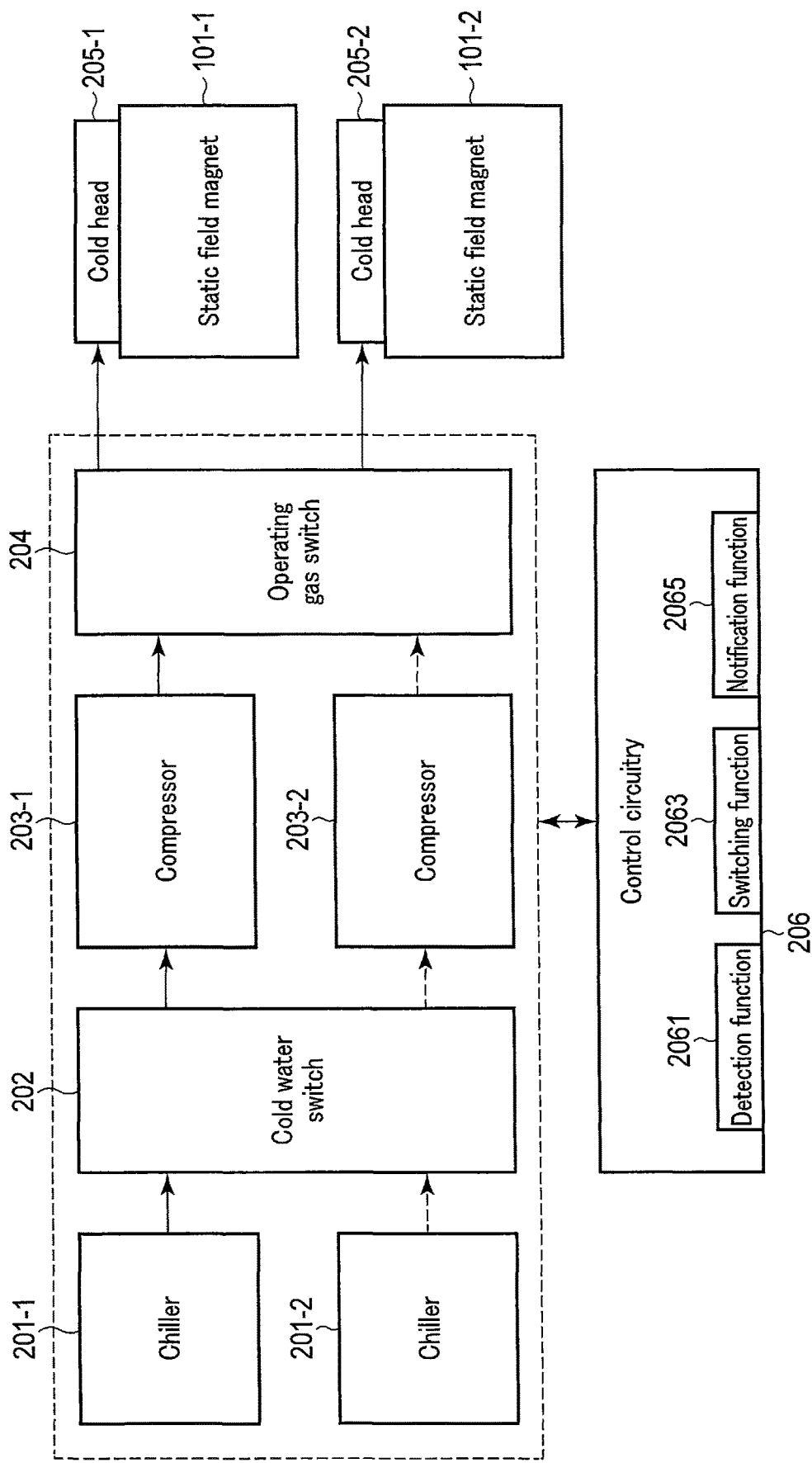
F I G. 3

MAGNETIC RESONANCE IMAGING SYSTEM, MAGNETIC RESONANCE IMAGING APPARATUS, COOLING CONTROL DEVICE, AND COOLING CONTROL METHOD

CROSS-REFERENCE TO RELATED APPLICATIONS

This application is based upon and claims the benefit of priority from Japanese Patent Application No. 2021-088649, filed May 26, 2021, the entire contents of which are incorporated herein by reference.

FIELD

Embodiments described herein relate generally to a magnetic resonance imaging system, a magnetic resonance imaging apparatus, a cooling control device, and a cooling control method.

BACKGROUND

In many magnetic resonance imaging (MRI) apparatuses, liquid helium is used as a refrigerant for a static field magnet. However, due to factors such as the recent rise in the market price of helium and tight demand, there is a need to reduce the amount of liquid helium used.

If the amount of refrigerant is small, the total amount of heat removed is also small, so if there is a failure in a refrigerator compressor for operating a refrigerator to cool a static field magnet or a cold water circulation device (also called a chiller) for cooling a compressor, the temperature inside the magnet increases in a few minutes to a few hours and the possibility of quenching cannot be ignored. Once quenching occurs, a large amount of refrigerant and a long operation time of the refrigerator are required for cooling to a re-excitable temperature, which leads to an increase in downtime and an increase in cost.

Therefore, it is conceivable to prepare two refrigerator compressors and two chillers as backups for one MRI apparatus, but there is a problem in that this requires more space and the price of the entire MRI apparatus increases.

BRIEF DESCRIPTION OF THE DRAWINGS

FIG. 2 is a block diagram showing a magnetic resonance imaging apparatus according to the present embodiment.

FIG. 3 is a block diagram showing a specific configuration example of a cooling apparatus including a cooling system and a cooling control device.

DETAILED DESCRIPTION

In general, according to one embodiment, a magnetic resonance imaging system includes a first magnetic resonance imaging apparatus, a first cooling system, a second magnetic resonance imaging apparatus, a second cooling system and a cooling control device. The first magnetic resonance imaging apparatus includes a first magnet configured to generate a static magnetic field. The first cooling system is configured to cool the first magnet. The second magnetic resonance imaging apparatus includes a second magnet configured to generate a static magnetic field. The second cooling system is configured to cool the second magnet. The cooling control device is configured to switch a cooling target of each of the first cooling system and the second cooling system.

Hereinafter, a magnetic resonance imaging system (hereinafter, referred to as an MRI system), an MRI apparatus, a cooling control device, and a cooling control method according to the present embodiment will be described with reference to the drawings. In the following embodiments, elements assigned with the same reference signs are assumed to perform the same operations, and redundant descriptions thereof will be omitted as appropriate.

Figure 1:
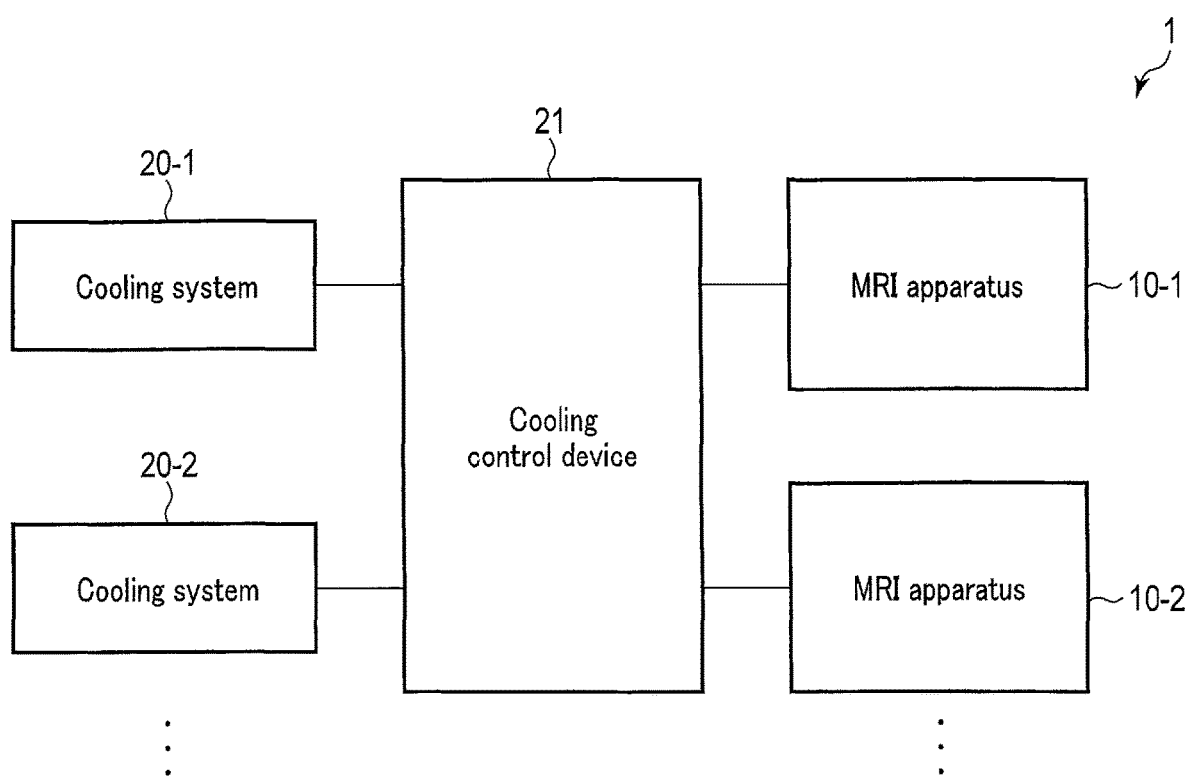
FIG. 1 is a conceptual diagram of a magnetic resonance imaging system according to a present embodiment.

FIG. 1 is a conceptual diagram showing an MRI system according to the present embodiment.

As shown in FIG. 1, an MRI system 1 includes a plurality of MRI apparatuses 10, a plurality of cooling systems 20, and a cooling control device 21. In the following, when a description is given without a sub-number, such as in the case of the MRI apparatus 10, that description is common to all of the same configurations.

In the examples of FIG. 1 and the subsequent drawings, a case where two sets, a set of an MRI apparatus 10-1 and a cooling system 20-1 and a set of an MRI apparatus 10-2 and a cooling system 20-2, are present in the MRI system 1 will be mainly described. However, the configuration is not limited thereto, and three or more sets of MRI apparatus 10 and cooling system 20 may be present. The cooling system 20 may not correspond to the MRI apparatus 10 one-to-one. For example, the number of cooling systems 20 may be two or more and equal to or less than the number of MRI apparatuses 10, and such a case will be described later with reference to FIG. 8.

By applying a high-frequency magnetic field to a subject, each MRI apparatus 10 collects a magnetic resonance signal (MR signal) acquired through a magnetic resonance phenomenon of a proton in a living body, and generates an MR image. The MRI apparatus 10 will be described later with reference to FIG. 2.

Each cooling system 20 is basically coupled to the MRI apparatus 10 one-to-one, and cools a static field magnet, which is a cooling target, in the MRI apparatus 10.

The cooling control device 21 is coupled to each MRI apparatus 10 and each cooling system 20, and executes cooling control switching between the cooling system 20 and the MRI apparatus 10. For example, when an anomaly occurs such as one of a plurality of cooling systems 20 failing, the cooling control device 21 switches coupling to another cooling system 20 that operates normally to cool a static field magnet of the MRI apparatus 10 to which the failed cooling system 20 was coupled.

Next, details of the MRI apparatus 10 will be described with reference to a block diagram of FIG. 2.

As shown in FIG. 2, the MRI apparatus 10 includes a static field magnet 101, a magnet management unit 30, a gradient coil 103, a gradient magnetic field power supply 105, a couch 107, couch control circuitry 109, transmission circuitry 113, a transmitter coil 115, a receiver coil 117, reception circuitry 119, sequence control circuitry 121, a bus 123, an interface 125, a display 127, a storage 129, and processing circuitry 131. The MRI apparatus 10 may have a hollow, cylindrical shim coil between the static field magnet 101 and the gradient coil 103.

The static field magnet 101 is a magnet formed in a hollow, approximately cylindrical shape. The static field magnet 101 is not necessarily in an approximately cylindrical shape, and may be formed in an open shape. The static field magnet 101 generates a uniform static magnetic field in its inner space. In the present embodiment, it is assumed that the static field magnet 101 is a superconducting magnet that uses a superconducting coil.

The gradient coil 103 is a coil formed in a hollow, cylindrical shape. The gradient coil 103 is arranged inside the static field magnet 101. The gradient coil 103 is formed by combining three coils respectively corresponding to X-, Y-, and Z-axes that are orthogonal to one another. The Z-axis direction is the same as the direction of the static magnetic field. In addition, the Y-axis direction is a vertical direction, and the X-axis direction is a direction perpendicular to each of the Z-axis and the Y-axis. The three coils of the gradient coil 103 are individually supplied with an electric current from the gradient magnetic field power supply 105, and generate gradient magnetic fields whose magnetic field intensity changes along the respective X-, Y-, and Z-axes.

The gradient magnetic field of each of the X-, Y-, and Z-axes generated by the gradient coil 103 forms, for example, a gradient magnetic field for frequency encoding (also referred to as a readout gradient field), a gradient magnetic field for phase encoding, and a gradient magnetic field for slice selection. The gradient magnetic field for frequency encoding is used to change the frequency of an MR signal in accordance with a spatial position. The gradient magnetic field for phase encoding is used to change the phase of an MR signal in accordance with a spatial position. The gradient magnetic field for slice selection is used to determine an imaging cross section.

The gradient magnetic field power supply 105 is a power supply device that supplies an electric current to the gradient coil 103 under control of the sequence control circuitry 121.

The couch 107 is a device with a couch top 1071 on which a subject P is placed. The couch 107 inserts the couch top 1071 on which the subject P is placed into a bore 111 under control of the couch control circuitry 109. The couch 107 is installed in an examination room, where the MRI apparatus 10 is installed, in such a manner that a longitudinal direction of the couch 107 is parallel to the central axis of the static field magnet 101.

The couch control circuitry 109 is circuitry that controls the couch 107, and drives the couch 107 in response to an operator's instruction via the interface 125 to move the couch top 1071 in the longitudinal direction and a vertical direction.

The transmitter coil 115 is an RF coil arranged on an inner side of the gradient coil 103. The transmitter coil 115 is supplied with a radio frequency (RF) pulse from the transmission circuitry 113, and generates a transmit RF wave corresponding to a high-frequency magnetic field. The transmitter coil 115 is, for example, a whole-body coil. The whole-body coil may be used as a transmitter/receiver coil.

A cylindrical RF shield is installed between the whole-body coil and the gradient coil 103 to magnetically separate these coils.

The transmission circuitry 113 supplies an RF pulse corresponding to a Larmor frequency, etc. to the transmitter coil 115 under the control of the sequence control circuitry 121.

The receiver coil 117 is an RF coil arranged on an inner side of the gradient coil 103. The receiver coil 117 receives an MR signal emitted from the subject P, caused by a high-frequency magnetic field. The receiver coil 117 outputs the received MR signal to the reception circuitry 119. The receiver coil 117 is, for example, a coil array including one or more, typically, a plurality of coil elements. The receiver coil 117 is a phased array coil, for example.

The reception circuitry 119 generates a digital MR signal which is digitized complex data, based on the MR signal output from the receiver coil 117, under the control of the sequence control circuitry 121. Specifically, the reception circuitry 119 performs various types of signal processing on the MR signal output from the receiver coil 117, and then performs analog-to-digital (A/D) conversion on the data subjected to the various types of signal processing. The reception circuitry 119 samples the A/D-converted data. The reception circuitry 119 thereby generates a digital MR signal (hereinafter referred to as MR data). The reception circuitry 119 outputs the generated MR data to the sequence control circuitry 121.

The sequence control circuitry 121 controls the gradient magnetic field power supply 105, the transmission circuitry 113, and the reception circuitry 119, etc. in accordance with an examination protocol output from the processing circuitry 131, and performs imaging on the subject P. An examination protocol includes various pulse sequences (also referred to as "imaging sequences") corresponding to the examination. The examination protocol defines a magnitude of an electric current supplied from the gradient magnetic field power supply 105 to the gradient coil 103, the timing of a supply of an electric current from the gradient magnetic field power supply 105 to the gradient coil 103, a magnitude of an RF pulse supplied from the transmission circuitry 113 to the transmitter coil 115, the timing of a supply of an RF pulse from the transmission circuitry 113 to the transmitter coil 115, the timing of reception of an MR signal at the receiver coil 117, etc.

The bus 123 is a transmission path for transmitting data between the interface 125, the display 127, the storage 129, and the processing circuitry 131. The bus 123 may be coupled via, for example, a network to various physiological signal measuring devices, an external storage, and various modalities. For example, an electrocardiograph (not shown) is coupled to the bus as physiological signal measuring equipment.

The interface 125 has a circuit for receiving various types of instructions and information input from an operator. The interface 125 includes, for example, a circuit relating to a pointing device such as a mouse or an input device such as a keyboard. The circuit included in the interface 125 is not limited to a circuit relating to a physical operational component, such as a mouse or a keyboard. For example, the interface 125 may include an electric signal processing circuit which receives an electric signal corresponding to an input operation from an external input device provided separately from the MRI apparatus 10, and outputs the received electric signal to various circuits.

The display 127 displays, for example, various magnetic resonance images (MR images) generated by an image generation function 1313, and various types of information relating to imaging and image processing, under control of a system control function 1311 in the processing circuitry 131. The display 127 is, for example, a display device such as a CRT display, a liquid crystal display, an organic EL display, an LED display, a plasma display, or any other display or monitor known in this technical field.

The storage 129 stores MR data with which the k space is filled via the image generation function 1313, image data generated by the image generation function 1313, etc. The storage 129 stores various types of examination protocols, an imaging condition including a plurality of imaging parameters that define an examination protocol, etc. The storage 129 stores programs corresponding to various functions that are implemented by the processing circuitry 131. The storage 129 is, for example, a semiconductor memory element, such as a random access memory (RAM) and a flash memory, a hard disk drive, a solid-state drive, or an optical disk, etc. The storage 129 may be, for example, a drive configured to read and write various kinds of information from and to a portable storage medium such as a CD-ROM drive, a DVD drive, or a flash memory.

The magnet management unit 30 includes a temperature measurement circuitry 301 and a pressure measurement circuitry 302.

The temperature measurement circuitry 301 measures a temperature of one or more superconducting coils forming the static field magnet 101, for example, by using a resistance-type temperature sensor.

The pressure measurement circuitry 302 measures a pressure of an operating gas for operating the cooling system 20 that cools the static field magnet 101 to be described later.

The processing circuitry 131 includes, as hardware resources, a processor (not shown) and a memory such as a read-only memory (ROM) and a RAM, and collectively controls the MRI apparatus 10. The processing circuitry 131 includes the system control function 1311, the image generation function 1313, a detection function 1315, and an estimation function 1317.

Such various functions of the processing circuitry 131 are stored in the storage 129 in the form of a program executable by a computer. The processing circuitry 131 is a processor which reads the programs corresponding to these various functions from the storage 129 and executes the programs to realize the functions corresponding to the respective programs. In other words, the processing circuitry 131 that has read the respective programs is equipped with, for example, a plurality of functions, etc. shown in the processing circuitry 131 of FIG. 2.

FIG. 2 illustrates the case where the various functions are realized by a single processing circuitry 131; however, the processing circuitry 131 may be formed by a combination of a plurality of independent processors, and the functions may be realized by the processors executing the programs. In other words, each of the above-described functions may be formed as a program, and a single processing circuitry may execute each program, or a specific function may be implemented in dedicated, independent program-execution circuitry.

Herein, the term "processor" used in the above explanation means, for example, circuitry such as a central processing unit (CPU), a graphics processing unit (GPU), an application-specific integrated circuit (ASIC), or a programmable logic device (e.g., a simple programmable logic device (SPLD), a complex programmable logic device (CPLD), or a field-programmable gate array (FPGA)).

The processor realizes various functions by reading and executing programs stored in the storage 129. A program may be directly integrated into the circuitry of the processor, instead of storing the program in the storage 129. In this case, the processor reads and executes the program integrated into the circuitry to realize the corresponding function. Similarly, the couch control circuitry 109, the transmission circuitry 113, the reception circuitry 119, the sequence control circuitry 121, etc. are each also formed as an electronic circuit, such as the above processor.

The processing circuitry 131 controls the MRI apparatus 10 by the system control function 1311. Specifically, the processing circuitry 131 reads a system control program stored in the storage 129, expands it in the memory, and controls each circuitry of the MRI apparatus 10 in accordance with the expanded system control program. For example, the processing circuitry 131 reads an examination protocol from the storage 129 by the system control function 1311 based on an imaging condition input by the operator via the interface 125. The processing circuitry 131 may generate the examination protocol based on the imaging condition. The processing circuitry 131 transmits the examination protocol to the sequence control circuitry 121 to control imaging of the subject P.

The processing circuitry 131 performs control by the system control function 1311 to apply an excitation pulse in accordance with an excitation pulse sequence and to apply a gradient magnetic field. After executing the excitation pulse sequence by the system control function 1311, the processing circuitry 131 collects an MR signal from the subject P in accordance with a data collection sequence, which is a pulse sequence for collecting various data, and thereby generates MR data.

By the image generation function 1313, the processing circuitry 131 fills the k space with the MR data along a readout direction in accordance with the intensity of a readout gradient magnetic field. The processing circuitry 131 generates an MR image by executing a Fourier transform on the MR data with which the k-space is filled. For example, the processing circuitry 131 can generate a magnitude image from complex MR data. The processing circuitry 131 can also generate a phase image by using real part data and imaginary part data of the complex MR data. The processing circuitry 131 outputs an MR image such as a magnitude image or a phase image to the display 127 and the storage 129.

The processing circuitry 131 detects, by the detection function 1315, whether or not an anomaly has occurred in the cooling system 20 of the static field magnet 101 based on, for example, information on the temperature and pressure from the magnet management unit 30.

When the cooling system 20 does not operate with respect to the static field magnet 101, the processing circuitry 131 estimates, by the estimation function 1317, a period during which imaging according to an imaging condition can be continued, in other words, when the temperature of the static field magnet 101 is a threshold value or more.

Next, a specific configuration example of the cooling apparatus including the cooling system 20 and the cooling control device 21 will be described with reference to FIG. 3.

The cooling apparatus shown in FIG. 3 includes a chiller 201-1 and a chiller 201-2, a cold water switch 202, a compressor 203-1 and a compressor 203-2, an operating gas switch 204, a cold head 205-1 and a cold head 205-2, and control circuitry 206.

The chillers 201-1 and 201-2, the compressors 203-1 and 203-2, and the cold heads 205-1 and 205-2 are part of the cooling system 20 for the MRI apparatus 10. Although not shown, the cooling system 20 includes a supply pipe, an exhaust pipe, a vent valve, an intake valve, and a buffer tank. The cold water switch 202, the operating gas switch 204, and the control circuitry 206 are part of the cooling control device 21.

In FIG. 3, a case is assumed in which two MRI apparatuses 10-1 and 10-2 are installed in their respective examination rooms, and the static field magnet 101-1 of the MRI apparatus 10-1 and the static field magnet 101-2 of the MRI apparatus 10-2 are respectively coupled to the cooling apparatuses. It is assumed that the cooling apparatus is arranged outside the examination room except for a portion coupled to the static field magnet 101, e.g., the cold head 205. The cooling apparatus may be placed in the examination room as long as the cooling apparatus is formed such that noise suppression and non-magnetic treatment are applied so that imaging is not affected even if it is placed in the examination room. Further, for convenience of explanation, illustration of elements other than the static field magnet 101 in each MRI apparatus 10 is omitted.

A specific configuration of the static field magnet 101 will now be described.

In the static field magnet 101, a superconducting magnet is realized by supplying an electric current to the superconducting coil in a superconducting state, and a static magnetic field is generated by the superconducting magnet. As an example, the superconducting coil is housed in a hollow, approximately cylindrical cooling container (not shown) together with liquid helium, which is a refrigerant for keeping the inside of the container at a sufficiently low temperature so as to maintain the superconducting state. The cooling container is housed in a cylindrical wall of a vacuum container (not shown). In the cooling container, liquid helium and helium gas vaporized from liquid helium are held in equilibrium.

Inside the cooling container, a heater (not shown) is provided. The heater heats and evaporates the helium inside the cooling container to adjust the pressure in the cooling container. The purpose of adjusting the pressure is, for example, to prevent an unintended flow of air into the cooling container. If the helium gas in the cooling container is excessively cooled, the proportion of the liquid helium in the cooling container increases, resulting in reduction of the pressure in the cooling container. If the pressure in the cooling container is reduced to a negative pressure, the air flows into the cooling container. The heater is controlled so that the pressure in the cooling container is within a preset range.

In the examples of FIG. 3 and the subsequent drawings, a case is assumed in which the static field magnet 101-1 of the MRI apparatus 10-1 has a larger amount of refrigerant, i.e., a larger amount of liquid helium in the cooling container, than the static field magnet 101-2 of the MRI apparatus 10-2. The configuration is not limited thereto, and the amount of liquid helium may be substantially the same between the static field magnet 101-1 and the static field magnet 101-2.

During normal operation, the chiller 201-1, the compressor 203-1, and the cold head 205-1 operate as the cooling system 20-1 for the static field magnet 101-1, and the chiller 201-2, the compressor 203-2, and the cold head 205-2 operate as the cooling system 20-2 for the static field magnet 101-2. That is, during normal operation, each magnet is cooled by an independent cooling system.

The chiller 201 is coupled to the compressor 203 via the cold water switch 202, and by circulating the cooling water, heat from the compressor 203 is removed and released into the atmosphere. In other words, the chiller 201 is a cooling water circulator that removes the heat from the compressor 203.

The cold water switch 202 switches the flow path of the cooling water between the chillers 201-1 and 201-2 and the compressors 203-1 and 203-2 in response to an instruction from the control circuitry 206. For example, the flow path may be switched by controlling a valve. It suffices that switching control of the flow path (path) by the valve is performed by a common method, and a specific description thereof will be omitted.

The compressor 203 is coupled to the cold head 205 via a supply pipe and an exhaust pipe. For example, an operating gas, which is a refrigerant such as helium gas, is compressed by a motor, and the operating gas in a high pressure state is supplied to the cold head 205 via the supply pipe. The compressor 203 recovers the operating gas expanded inside the cold head 205 via the exhaust pipe. The compressor 203 is coupled to a buffer tank filled with an operating gas via a vent valve and an intake valve. The buffer tank is filled with the operating gas. The compressor 203 exhausts the operating gas to the buffer tank via the vent valve. The compressor 203 takes in the operating gas within the buffer tank via the intake valve.

The operating gas switch 204 switches the flow path of the operating gas between the compressors 203-1 and 203-2 and the cold heads 205-1 and 205-2 in response to an instruction from the control circuitry 206. For example, the flow path may be switched by controlling a gas valve. The switching control of the flow path (path) by the valve may be performed by a general method, and a specific description thereof will be omitted.

The cold head 205 is an end portion of the cooling system 20 in contact with the static field magnet 101, expands the operating gas in a high pressure state supplied through the supply pipe, and cools the refrigerant stored in the cooling container. The cold head 205 cools the refrigerant stored in the cooling container to a temperature equal to or lower than a boiling point of that refrigerant. When the cooling container is cooled to a certain degree or more, the helium gas in the cooling container is re-condensed to be liquid helium. FIG. 1 shows an example in which the magnet is provided with one cold head 205; however, the number of cold heads 205 is not limited to one and may be two or more.

The control circuitry 206 includes a detection function 2061, a switching function 2063, and a notification function 2065, and controls the operations of the cooling system 20 and the cooling control device 21. The control circuitry 206 may be realized by a processor such as a CPU, GPU, or ASIC.

The control circuitry 206 detects an anomaly in the cooling system 20 by the detection function 2061. In the anomaly detection, it suffices to detect that there is an anomaly in the cooling system 20 when, for example, a remaining amount of refrigerant that cools a magnet, an operating state of a compressor, a gas pressure of an operating gas, an operating state of a chiller, a flow rate of cooling water, etc. are out of a normal range.

When an anomaly in the cooling system 20 is detected, the control circuitry 206 controls, by the switching function 2063, at least one of the cold water switch 202 or the operating gas switch 204 according to the anomalous state, to switch the flow path of the cooling water or the operating gas.

When an anomaly is detected, the control circuitry 206 notifies, by the notification function 2065, the outside of the occurrence of the anomaly. Further, the control circuitry 206 notifies, by the notification function 2065, the outside of a switching signal indicating that the flow path of the cooling system 20 is being switched and operated.

The vent valve and the intake valve are provided in a pipe connecting the compressor 203 and the buffer tank. The vent valve exhausts the operating gas in the compressor 203 to the buffer tank. Exhausting of the operating gas from the compressor 203 reduces the pressure of the operating gas to be supplied from the compressor 203 to the cold head 205. The intake valve supplies the operating gas within the buffer tank to the compressor 203, for example, in accordance with an instruction from the control circuitry 206. Supply of the operating gas to the compressor 203 increases the pressure of the refrigerant gas to be supplied from the compressor 203 to the cold head 205.

Figure 4:
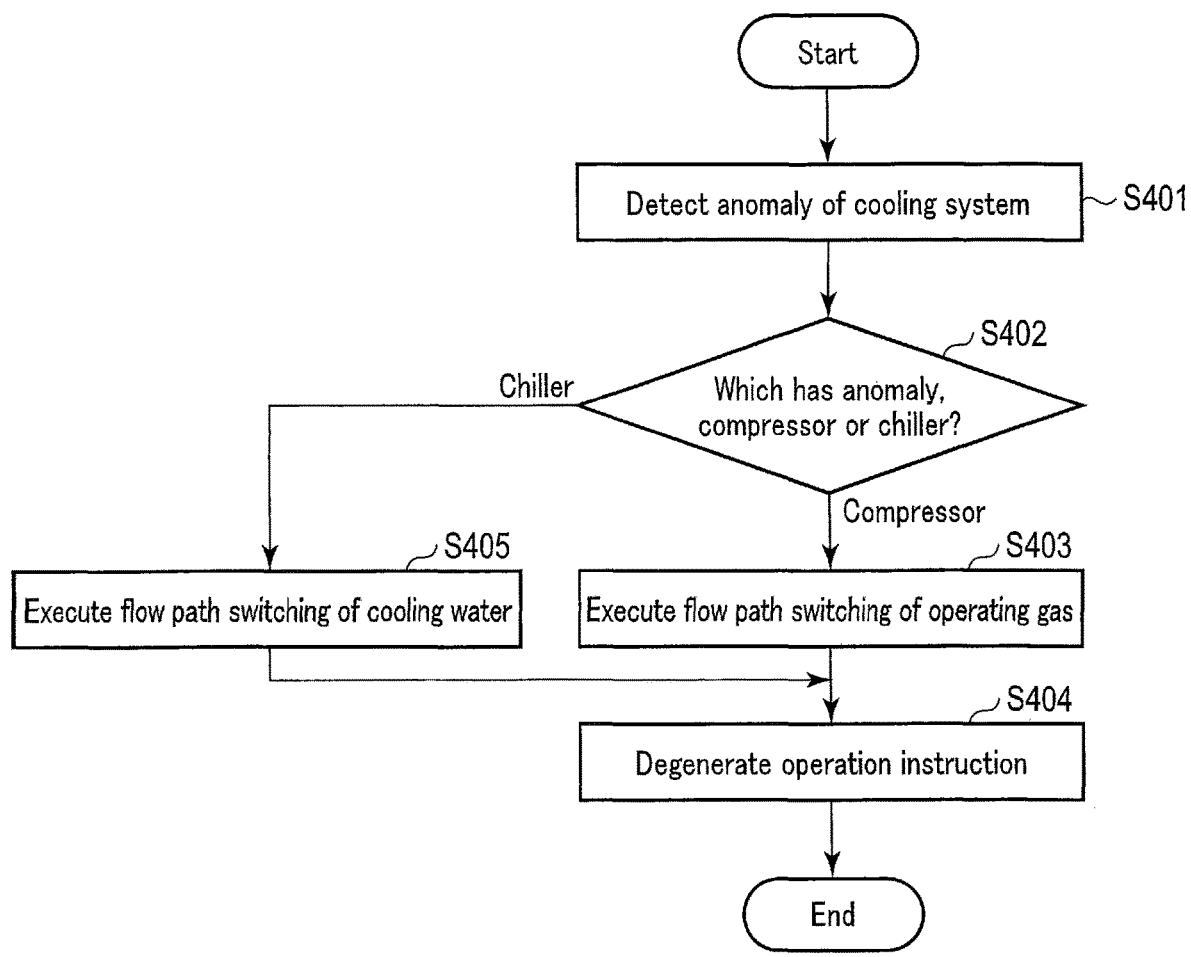
FIG. 4 is a flowchart showing an operation of the magnetic resonance imaging system.

Next, a switching operation in the MRI system 1 according to the present embodiment will be described with reference to the flowchart shown in FIG. 4.

In step S401, an anomaly in the cooling system 20 is detected. As a method for detecting an anomaly, for example, in addition to the above-described method in the detection function 2061 of the control circuitry 206, if the chiller 201 or the compressor 203 itself can issue an error, an anomaly in the cooling system 20 may be detected by the chiller 201 or the compressor 203 transmitting an error signal to the control circuitry 206 and the control circuitry 206 receiving that error signal. In addition, if the control circuitry 206 at all times or periodically acquires a state signal from the cooling system 20 indicating that it is operating normally, the control circuitry 206 may determine, by the detection function 2061, that the cooling system 20 is has an anomaly when that operating signal cannot be acquired. Further, the anomaly detection process may be executed not in the control circuitry 206 but in the processing circuitry 131 of each MRI apparatus 10.

In step S402, it is determined in which specific location the anomaly has occurred. Here, it is determined whether the anomaly has occurred in the compressor 203 or the chiller 201. That is, in the control circuitry 206 of the cooling control device 21 or each MRI apparatus 10, if an error signal is acquired or a state signal cannot be acquired from the compressor 203, it may be determined that an anomaly has occurred in the compressor 203, and if an error signal is acquired or a state signal cannot be acquired from the chiller 201, it may be determined that an anomaly has occurred in the chiller 201. If there is an anomaly in the compressor 203, the process proceeds to step S403, and if there is an anomaly in the chiller 201, the process proceeds to step S405.

In step S403, the switching function 2063 of the control circuitry 206 controls the operating gas switch 204 to switch the flow path of the operating gas so that an operating gas from the normal compressor 203 is supplied to the cold head 205 of the static field magnet 101 of the MRI apparatus 10 coupled at normal times to the compressor 203 in which the anomaly has occurred.

In step S404, for example, the notification function 2065 of the control circuitry 206 transmits a degenerate operation signal indicating a degenerate operation instruction for performing imaging more restricted than normal imaging to each MRI apparatus 10.

In step S405, the switching function 2063 of the control circuit 206 controls the cold water switch 202 to switch the flow path of the cooling water so that cooling water from the normal chiller 201 is supplied to the compressor 203 coupled at normal times to the chiller 201 in which the anomaly has occurred. After that, the process proceeds to step S404, and the degenerate operation signal is transmitted to each MRI device 10.

When occurrence of an anomaly in the cooling system 20 and a faulty part are detected, a switching signal including at least any one of the occurrence of the anomaly, a location of anomaly occurrence, a degenerate operation being performed, and which cooling system flow path is being switched and operated, may be reported to the outside by the notification function 2065 of the control circuitry 206. For example, the cooling control device 21 automatically notifies a medical staff and a service person of the switching signal, thereby shortening a period until a repair is started and contributing to reduction of downtime during which the MRI apparatus 10 cannot be used and reduction of cost.

Next, a first example of a switching process when an anomaly occurs at a part of the cooling system 20 will be described with reference to FIG. 5.

Figure 5:
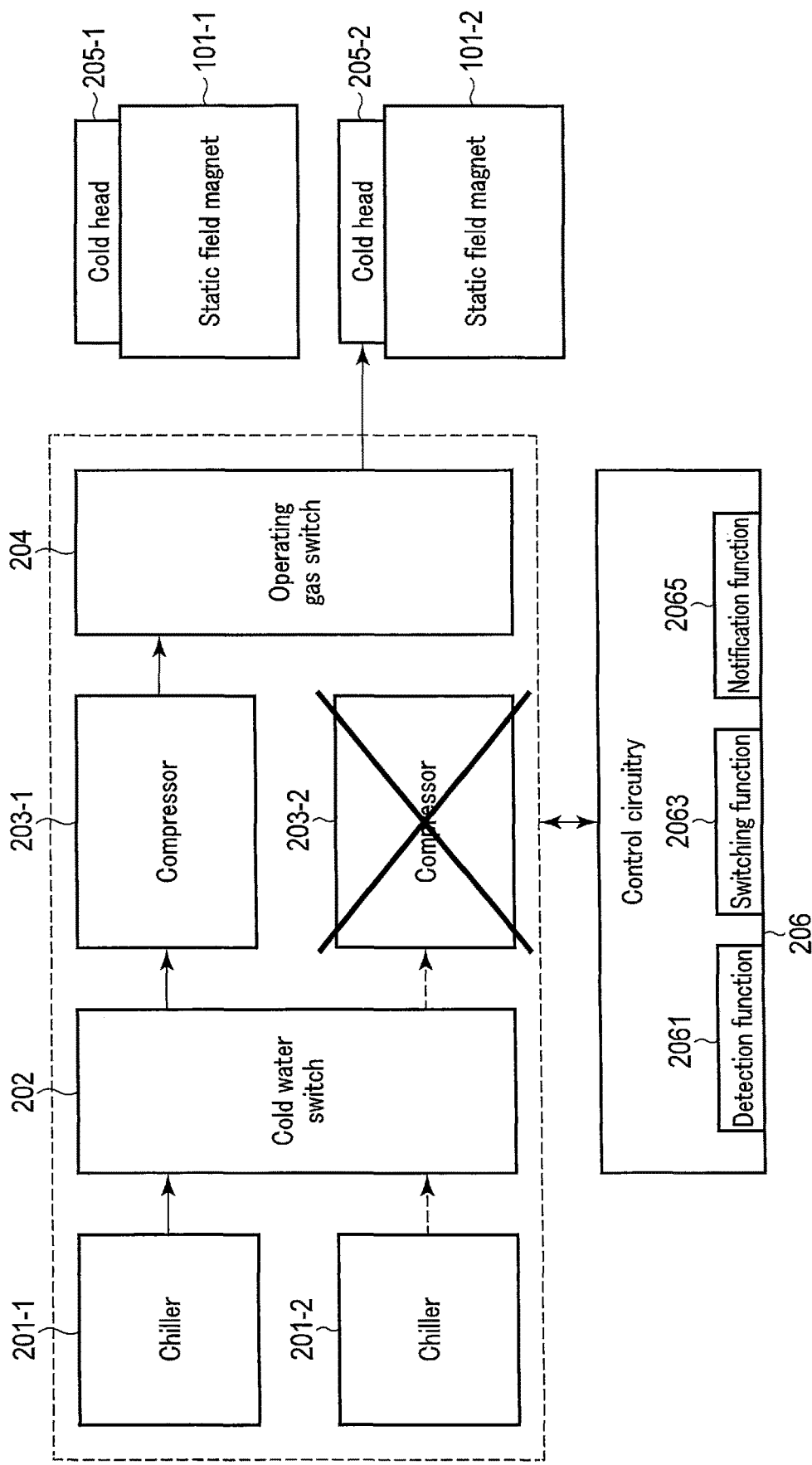
FIG. 5 is a diagram showing a first example of switch processing in a case where an anomaly occurs at a part of a cooling system.

FIG. 5 assumes a case in which the compressor 203-2, which is one of the cooling systems 20 shown in FIG. 3, fails. In this case, it is assumed that the control circuitry 206 detects the anomaly from a state signal of the compressor 203-2. According to an instruction from the control circuitry 206, the operating gas switch 204 switches the flow path so as to supply an operating gas of the compressor 203-1 to the cold head 205-2 coupled to the static field magnet 101-2. Due to this switching, the static field magnet 101-1 is not cooled by the cooling system 20. Thus, depending on the control operation of the MRI apparatus 10-1, there may for example be a function of detecting an anomaly in cooling of the static field magnet 101 by a pressure sensor that detects a pressure of an operating gas supplied to the cold head 205-1 and stopping the apparatus from entering the next imaging as error handling.

The MRI apparatus 10 that is stopped in this way may be left in the stopped state, or may be allowed to continue imaging under predetermined imaging condition. For example, before a switching instruction to the operating gas switch 204 is transmitted from the control circuitry 206, or at almost the same time as that switching instruction, a degenerate operation signal may be transmitted from the control circuitry 206 to the sequence control circuitry 121, etc. of the MRI apparatus 10. With the MRI apparatus 10 that has received the degenerate operation instruction, for example, normal imaging is possible for one day, but after that, imaging is continued with predetermined imaging conditions such as the number of persons to be imaged or times of imaging per day limited, and imaging by an imaging sequence in which a magnetic field is frequently switched and an amount of heat generated by a coil is large such as EPI (Echo Planar Imaging) cannot be performed. As the imaging conditions, as described above, conditions such as the number of times of imaging, the number of persons to be imaged, and the type of imaging sequence are conceivable. However, the imaging conditions are not limited thereto as long as a condition under which a temperature increase of the static field magnet 101 can be prevented as much as possible or a rate of temperature increase can be reduced is used.

Further, in the MRI apparatus 10-1, a period during which imaging can be continued in a state where the static field magnet 101-1 is not cooled may be estimated. For example, by the estimation function 1317 of the processing circuitry 131 of the MRI apparatus 10-1, a time when the temperature of the static field magnet 101-1 becomes a threshold value or more is estimated based on a current temperature of the static field magnet 101-1 from the magnet management unit 30 and an estimated temperature increase of the static field magnet 101-1 in a case of executing an imaging sequence assumed from a future examination schedule, etc. As a result, it is possible to estimate how long imaging will be possible, so that it becomes easy to make a repair schedule for the cooling system 20 while reducing downtime as much as possible. The control circuitry 206 of the cooling control device 21 may acquire information on the temperature of the static field magnet 101-1 of the MRI apparatus 10-1 to estimate the period during which imaging is possible as described above.

A reason why imaging can be continued even if the cooling of the static field magnet 101 is stopped is that when an amount of the refrigerant (liquid helium) of the static field magnet 101 is large, even if the cooling system 20 is stopped, the temperature inside the static field magnet would not immediately increase to a temperature at which a superconducting state is broken, due to heat removal by liquid helium evaporation. Thus, the imaging can be continued for a predetermined period.

If the compressor 203-1 is set to stop the operation when the gas pressure of the operating gas changes by a threshold value or more, there is a possibility that the compressor 203-1 may stop because the gas pressure changes in the process of switching from the cold head 205-1 to the cold head 205-2 by the operating gas switch 204. In this case, since a degenerate operation signal indicating that the switching process has been performed is transmitted to each of the MRI apparatus 10-1 and the MRI apparatus 10-2, a reset signal prompting a restart may be transmitted to the compressor 203-1 from the MRI apparatus 10 and the operation of the compressor 203-1 may be restarted. Further, the compressor 203-1 may be restarted by the control circuitry 206, in which case the compressor 203-1 can be restarted from either the MRI apparatus 10-1 or the MRI apparatus 10-2 via the control circuitry 206.

An allowable range related to a change in gas pressure assumed in a switching process may be set for the compressor 203. As a result, even if the switching process is executed, the change in gas pressure is expected in advance, so that the compressor 203 can operate without stopping.

Next, a second example of a switching process when an anomaly occurs at a part of the cooling system 20 will be described with reference to FIG. 6.

Figure 6:
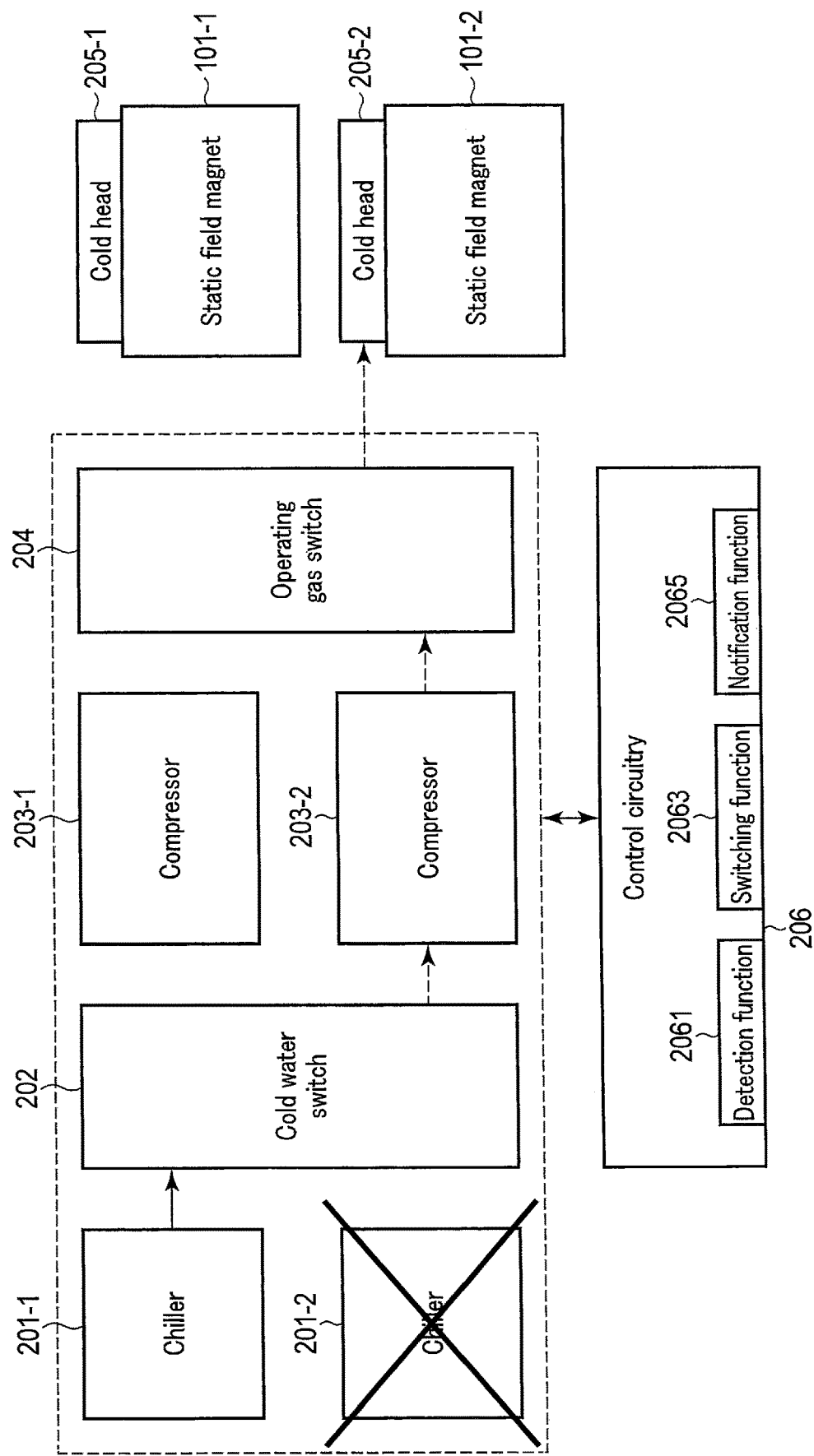
FIG. 6 is a diagram showing a second example of switch processing in a case where an anomaly occurs at a part of the cooling system.

In contrast to FIG. 5, FIG. 6 assumes a case in which the chiller 201-2 fails instead of the compressor 203-2.

For example, the control circuitry 206 detects, by the detection function 2061, that the chiller 201-2 has an anomaly from a state signal of the chiller 201-2.

According to an instruction of the control circuitry 206 by the switching function 2063, the cold water switch 202 switches the flow path so as to supply cooling water of the chiller 201-1 to the compressor 203-2. Due to this switching, depending on the control design of the MRI apparatus 10, the compressor 203-1 may stop due to non-flowing of the cooling water, and then cooling of the static field magnet 101-1 may stop due to the stopping of the compressor 203-1. As a result, as in the case of FIG. 5, there may be a function of stopping the apparatus from entering the next imaging as error handling.

Even in such a case, a degenerate operation signal may be transmitted to the sequence control circuit 121 of the MRI apparatus 10-1 before a switching instruction to the cold water switch 202 is transmitted from the control circuitry 206 or almost at the same time as the switching instruction.

Further, as for the compressor 203-2 and the chiller 201-1, the operations thereof may be stopped because a water pressure of the cooling water fluctuates in the switching operation. In this case as well, similarly to FIG. 5, the MRI apparatus 10-1 and the MRI apparatus 10-2 may transmit a reset signal to the chiller 201-1 and the compressor 203-2, respectively, to restart them.

Next, a third example of a switching process when an anomaly occurs at a part of the cooling system will be described with reference to FIG. 7.

Figure 7:
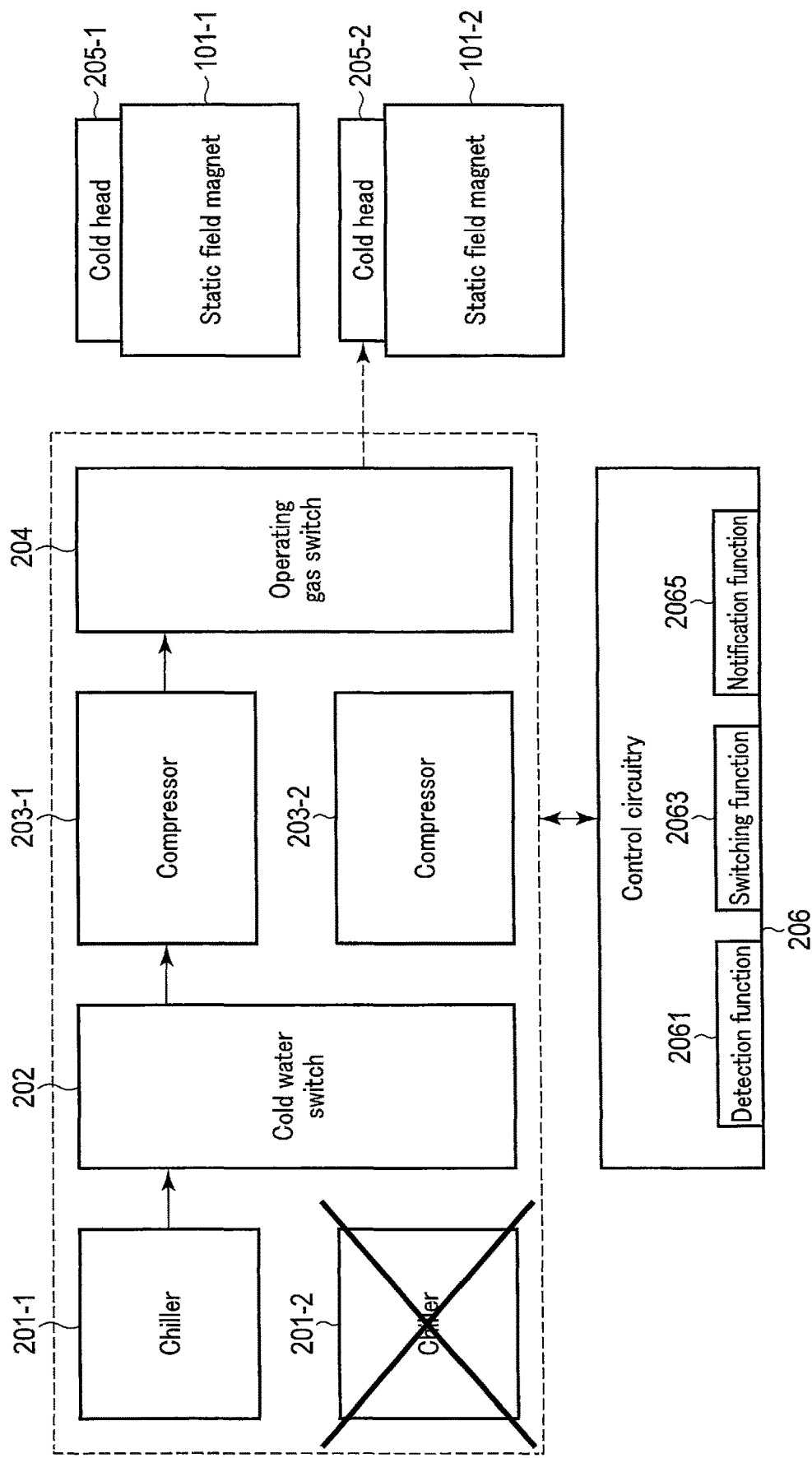
FIG. 7 is a diagram showing a third example of switch processing in a case where an anomaly occurs at a part of the cooling system.

FIG. 7 shows a case in which an anomaly occurs in the chiller 201-2 as in FIG. 6, but the switching means is different from that in FIG. 6. That is, instead of switching the flow path of the cooling water of the chiller 201-1 to the compressor 203-2 side by the cold water switch 202, the flow path of the operating gas of the compressor 203-1 is switched to the cold head 205-2 side by the operating gas switch 204, while the flow path of the chiller 201-1 is still coupled to the compressor 203-1 as in the normal operation. As described above, when an anomaly occurs in the chiller 201, the flow path of either the cold water switch 202 or the operating gas switch 204 may be switched.

Figure 8:
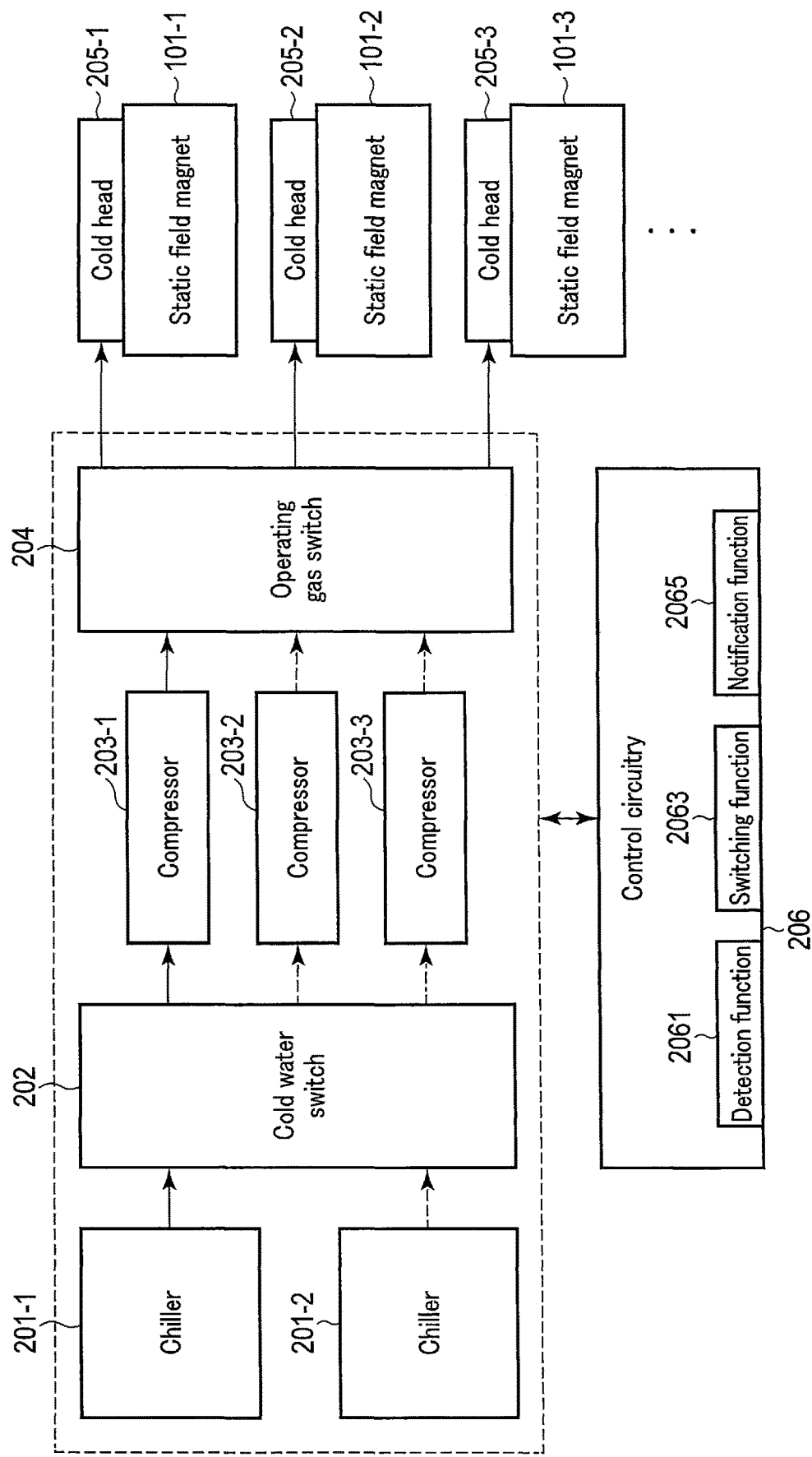
FIG. 8 is a block diagram showing an example in a case where the number of cooling systems is different from that of magnetic resonance imaging apparatuses.

Next, an example of a case in which the number of MRI apparatuses is the same as the number of the cooling systems 20 or more in the MRI system 1 will be described with reference to FIG. 8.

Even when there are three or more sets of MRI apparatuses 10 and cooling systems 20, the flow path of the cooling system 20 can be switched in the same manner as in the cases shown in FIGS. 5 to 7. That is, the static field magnet 101 may be cooled by a cooling system 20 that operates normally rather than the chiller 201 or the compressor 203 in which an anomaly occurs by switching the flow path of the cooling water or the operating gas.

Further, the number of cooling systems 20 may be smaller than the number of MRI apparatuses 10, and in this case, the static field magnet 101 may be cooled by sequentially switching the flow path even during the normal operation. In the example of FIG. 8, a case is shown in which two chillers 201 (chiller 201-1 and chiller 201-2), three compressors (compressor 203-1, compressor 203-2, and compressor 203-3), and three static field magnets 101 (static field magnet 101-1, static field magnet 101-2, and static field magnet 101-3) are arranged. The control circuitry 206 may control the cold water switch 202 such that the chiller 201-1 and the chiller 201-2 are switched in a time-division manner, the cooling water circulates evenly to each compressor 203, and each static field magnet 101 is cooled as a result.

Similarly, each static field magnet 101 may be cooled in a time-division manner also in the cases of FIGS. 5 to 7 described above. An example of switching the flow path of the cooling system 20 in a time-division manner is shown in FIG. 9.

Figure 9:
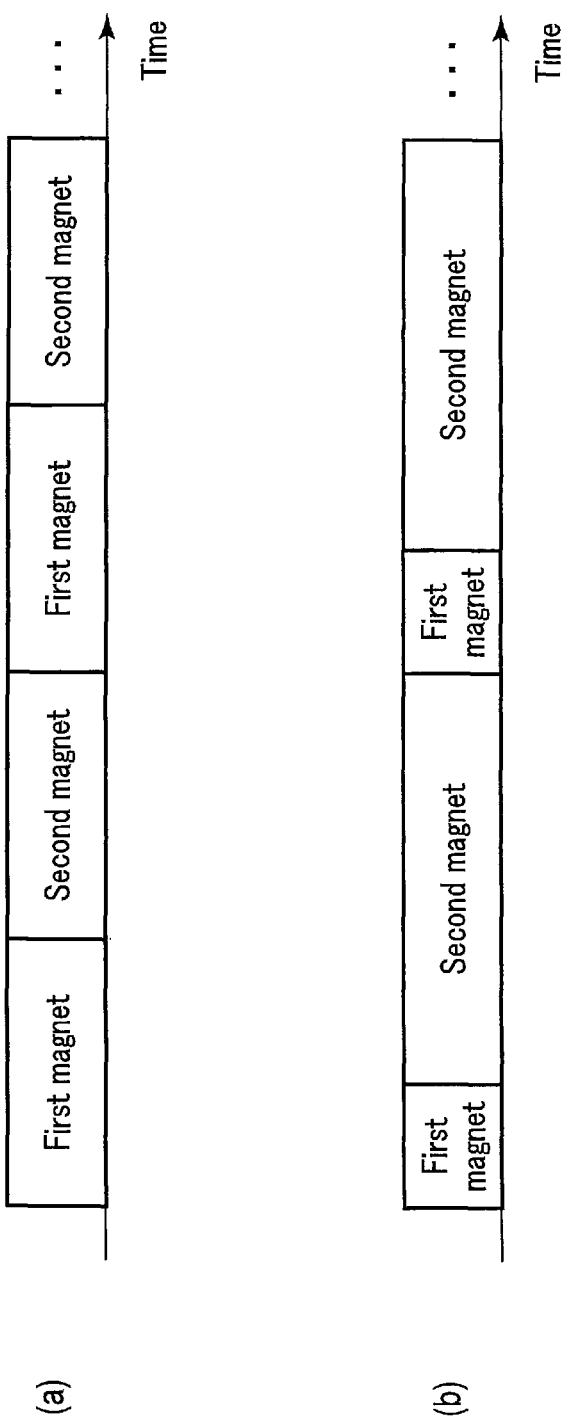
FIG. 9 is a diagram showing an example of cooling in a time-division manner.

FIG. 9 (a) is a cooling pattern when the static field magnet 101-1 and the static field magnet 101-2 are cooled for an equal time when an anomaly occurs in the cooling system 20. Further, FIG. 9 (b) is a cooling pattern when the static field magnet 101-1 and the static field magnet 101-2 are cooled for an unequal time. For example, in a case of two magnets of the same type, a time to quenching for the static field magnet 101-1 and the static field magnet 101-2 generally depends on an amount of remaining refrigerant. Thus, a cooling time may be allocated according to the amount of remaining refrigerant.

Further, when the size of the magnet is different between the static field magnet 101-1 and the static field magnet 101-2, an amount of refrigerant required for cooling is also different. Thus, an estimated time to quenching may be calculated for each magnet, and the cooling time may be allocated in a time-division manner so that the shorter the estimated time to quenching, the longer the cooling time.

For example, the flow path of the cooling system 20 may be switched in a time-division manner so that the smaller the amount of refrigerant in the static field magnet 101, the longer the cooling time. In the case of FIG. 9 (*b*), since it is assumed that the static field magnet 101-1 has a larger amount of refrigerant than the static field magnet 101-2, the cooling time may be allocated such that the time for cooling the static field magnet 101-1 is short and the time for cooling the static field magnet 101-2 is long. By doing this, even if an anomaly occurs in a cooling system, cooling control can be performed so that the plurality of MRI apparatuses 10 en bloc can continue imaging as much as possible.

In the above-described examples, it is assumed that the cooling control device 21 completely switches the flow path by the cold water switch 202 and the operating gas switch 204, but the present invention is not limited thereto, and the flow path may be controlled such that one cooling system 20 cools each of a plurality of static field magnets 101. In other words, the cold water switch 202 may distribute the cooling water to the respective paths, and the operating gas switch 204 may distribute the operating gas to the respective paths. For example, a valve of the cold water switch 202 may be formed so that a flow path for circulating cooling water from the chiller 201-1 to each of the compressors 203-1 and 203-2 can be formed.

According to the present embodiment described above, by providing a cooling control device including a cold water switch and an operating gas switch for switching flow paths of a plurality of cooling systems and a control circuitry for controlling these switches, even if an anomaly occurs in a cooling system, an MRI apparatus can be cooled by switching a path of another cooling system that operates normally. For example, in an MRI apparatus with a large amount of refrigerant, imaging can be continued for several days, and in an MRI apparatus with a small amount of refrigerant, imaging can be continued by switching and coupling a flow path from a cooling system so as to cool a static field magnet.

As a result, it is possible to continue imaging as much as possible while avoiding factors leading to downtime such as quenching of an MRI apparatus with a small amount of refrigerant, and it is possible to eliminate or shorten the downtime during which imaging cannot be continued. In addition, since cooling is continued in the MRI apparatus with a small amount of refrigerant, a period for repair can be secured.

According to at least one embodiment described above, a backup system for magnet cooling can be provided with a simpler configuration.

While certain embodiments have been described, they have been presented by way of example only, and they are not intended to limit the scope of the inventions. The embodiments described herein may be embodied in a variety of other forms; furthermore, various omissions, substitutions, changes or combinations of the embodiments may be made without departing from the spirit of the inventions. The embodiments and their modifications are included in the scope and spirit of the invention and are included in the scope of the claimed inventions and their equivalents.

In relation to the foregoing embodiments, etc., the following disclosures are additionally given as one aspect and selective features of the invention.

(Additional Note 1)

A magnetic resonance imaging system including
a first magnetic resonance imaging apparatus including a first magnet that generates a static magnetic field,
a first cooling system that cools the first magnet,
a second magnetic resonance imaging apparatus including a second magnet that generates a static magnetic field,
a second cooling system that cools the second magnet, and
a cooling control device that switches a cooling target of each of the first cooling system and the second cooling system.

(Additional Note 2)

The first cooling system may include a first compressor that controls compression and expansion of an operating gas for cooling the first magnet, and a first chiller that circulates cooling water for removing heat from the first compressor. The second cooling system may include a second compressor that controls compression and expansion of an operating gas for cooling the second magnet, and a second chiller that circulates cooling water for removing heat from the second compressor.

(Additional Note 3)

The cooling control device may include an operating gas switch capable of switching a flow path of an operating gas between the first and second compressors and the first and second magnets, and a cold water switch capable of switching a flow path of cooling water between the first and second chillers and the first and second compressors.

(Additional Note 4)

The operating gas switch may switch a flow path of an operating gas of the second compressor so as to cool the first magnet when an anomaly occurs in the first compressor, and may switch a flow path of an operating gas of the first compressor so as to cool the second magnet when an anomaly occurs in the second compressor.

(Additional Note 5)

The cold water switch may switch a flow path of cooling water of the second chiller so as to be coupled to the first compressor when an anomaly occurs in the first chiller, and may switch a flow path of cooling water of the first chiller so as to be coupled to the second compressor when an anomaly occurs in the second chiller.

(Additional Note 6)

The operating gas switch may switch a flow path of an operating gas of the second compressor so as to cool the first magnet when an anomaly occurs in the first chiller, and may switch a flow path of an operating gas of the first compressor so as to cool the second magnet when an anomaly occurs in the second chiller.

(Additional Note 7)

The cooling control device may generate a degenerate operation signal for causing a magnetic resonance imaging apparatus to which a cooling system is not coupled to continue imaging under a predetermined imaging condition, and the first magnetic resonance imaging apparatus or the second magnetic resonance imaging apparatus that receives the degenerate operation signal may continue imaging according to the imaging condition.

(Additional Note 8)

The cooling control device may generate a degenerate operation signal for causing a magnetic resonance imaging apparatus to which a cooling system is not coupled to continue imaging under a predetermined imaging condition, and the first magnetic resonance imaging apparatus or the second magnetic resonance imaging apparatus that receives the degenerate operation signal may estimate a period during which imaging is possible according to the imaging condition.

(Additional Note 9)

The imaging condition may include at least one of the number of times of imaging or the type of imaging sequence.

(Additional Note 10)

The magnetic resonance imaging system may further include a detection unit that detects an anomaly in the first cooling system and the second cooling system, and a notification unit that, when an anomaly is detected by the detection unit, notifies the outside of a switching signal indicating that a flow path of the first cooling system or the second cooling system is being switched and operated.

(Additional Note 11)

The cooling control device may, when an anomaly occurs in one of the first cooling system and the second cooling system, cool the first magnet and the second magnet in a time-division manner by using a cooling system that operates normally.

(Additional Note 12)

A first refrigerant amount held by the first magnet may be larger than a second refrigerant amount held by the second magnet.

(Additional Note 13)

The cooling control device may perform cooling in a time-division manner such that a cooling time of the second magnet is longer than a cooling time of the first magnet.

(Additional Note 14)

A magnetic resonance imaging system including
a plurality of magnetic resonance imaging apparatuses each including a magnet that generates a static magnetic field,
a plurality of cooling systems equal to or less in number than the magnetic resonance imaging apparatuses and that cool the magnet, and
a cooling control device that switches a cooling target between the cooling systems and the magnetic resonance imaging apparatuses.

(Additional Note 15)

A control method related to a plurality of magnetic resonance imaging apparatuses each including a magnet that generates a static magnetic field, and a plurality of cooling systems equal to or less in number than the magnetic resonance imaging apparatuses and that cool the magnet,
in which the control method includes, when an anomaly occurs in a part of the cooling systems, switching a cooling target by switching coupling of a flow path between a cooling system that operates normally and the magnetic resonance imaging apparatuses.

(Additional Note 16)

Depending on a refrigerant amount and an estimated time to quenching of the first magnet and the second magnet, the cooling control device may perform cooling in a time-division manner such that the smaller the refrigerant amount, the longer the cooling time, and the shorter the estimated time to quenching, the longer the cooling time.

(Additional Note 17)

A first refrigerant amount held by the first magnet may be substantially equal to a second refrigerant amount held by the second magnet.

(Additional Note 18)

The cooling control device may control a flow path such that one cooling system cools both the first magnet and the second magnet.

(Additional Note 19)

A magnetic resonance imaging apparatus including
a first magnet that generates a static magnetic field,
a first cooling system that cools the first magnet, and
a cooling switch that couples the first cooling system and a second magnet of another magnetic resonance imaging apparatus and switches to cooling the second magnet by the first cooling system.

(Additional Note 20)

A magnetic resonance imaging apparatus including
a first magnet that generates a static magnetic field,
a first cooling system that cools the first magnet, and
a cooling switch coupled to a second cooling system for cooling a second magnet of another magnetic resonance imaging apparatus and that switches to cooling the first magnet by the second cooling system.

(Additional Note 21)

A cooling control device that executes cooling control between a plurality of magnetic resonance imaging apparatuses each including a magnet that generates a static magnetic field and a plurality of cooling systems equal to or less in number than the magnetic resonance imaging apparatuses and that cool the magnet,
in which, when an anomaly occurs in a part of the cooling systems, the cooling control device switches a cooling target by switching coupling of a flow path between a cooling system that operates normally and the magnetic resonance imaging apparatuses.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A magnetic resonance imaging system comprising:
    a first magnetic resonance imaging apparatus including a first magnet configured to generate a static magnetic field;
    a first cooling system configured to cool the first magnet;
    a second magnetic resonance imaging apparatus including a second magnet configured to generate a static magnetic field;
    a second cooling system configured to cool the second magnet; and
    a cooling control device configured to switch a cooling target of each of the first cooling system and the second cooling system.

2. The magnetic resonance imaging system according to claim 1, wherein
    the first cooling system includes:
        a first compressor configured to control compression and expansion of an operating gas for cooling the first magnet; and
        a first chiller configured to circulate cooling water for removing heat from the first compressor, and the second cooling system includes:
        a second compressor configured to control compression and expansion of an operating gas for cooling the second magnet; and
        a second chiller configured to circulate cooling water for removing heat from the second compressor.

3. The magnetic resonance imaging system according to claim 2, wherein
the cooling control device includes:
an operating gas switch configured to switch a flow path of an operating gas between the first and second compressors and the first and second magnets; and
a cold water switch configured to switch a flow path of cooling water between the first and second chillers and the first and second compressors.

4. The magnetic resonance imaging system according to claim 3, wherein the operating gas switch is configured to:
switch a flow path of an operating gas of the second compressor so as to cool the first magnet when an anomaly occurs in the first compressor; and
switch a flow path of an operating gas of the first compressor so as to cool the second magnet when an anomaly occurs in the second compressor.

5. The magnetic resonance imaging system according to claim 3, wherein the cold water switch is configured to:
switch a flow path of cooling water of the second chiller so as to be coupled to the first compressor when an anomaly occurs in the first chiller; and
switch a flow path of cooling water of the first chiller so as to be coupled to the second compressor when an anomaly occurs in the second chiller.

6. The magnetic resonance imaging system according to claim 3, wherein the operating gas switch is configured to:
switch a flow path of an operating gas of the second compressor so as to cool the first magnet when an anomaly occurs in the first chiller; and
switch a flow path of an operating gas of the first compressor so as to cool the second magnet when an anomaly occurs in the second chiller.

7. The magnetic resonance imaging system according to claim 1, wherein
the cooling control device is configured to generate a degenerate operation signal for causing a magnetic resonance imaging apparatus to which a cooling system is not coupled to continue imaging under a predetermined imaging condition, and
the first magnetic resonance imaging apparatus or the second magnetic resonance imaging apparatus that receives the degenerate operation signal is configured to continue imaging according to the imaging condition.

8. The magnetic resonance imaging system according to claim 1, wherein
the cooling control device is configured to generate a degenerate operation signal for causing a magnetic resonance imaging apparatus to which a cooling system is not coupled to continue imaging under a predetermined imaging condition, and
the first magnetic resonance imaging apparatus or the second magnetic resonance imaging apparatus that receives the degenerate operation signal is configured to estimate a period during which imaging is possible according to the imaging condition.

9. The magnetic resonance imaging system according to claim 7, wherein the imaging condition includes at least one of a number of times of imaging or a type of imaging sequence.

10. The magnetic resonance imaging system according to claim 1, further comprising control circuitry configured to:
detect an anomaly of the first cooling system and the second cooling system; and
notify an outside of a switching signal when an anomaly is detected, the switching signal indicating that a flow path of the first cooling system or the second cooling system is being switched and operated.

11. The magnetic resonance imaging system according to claim 1, wherein the cooling control device is configured to, when an anomaly occurs in one of the first cooling system and the second cooling system, cool the first magnet and the second magnet in a time-division manner by using a cooling system that operates normally.

12. The magnetic resonance imaging system according to claim 1, wherein a first refrigerant amount held by the first magnet is larger than a second refrigerant amount held by the second magnet, or an estimated time for the first magnet to quenching is longer than an estimated time for the second magnet to quenching.

13. The magnetic resonance imaging system according to claim 12, wherein the cooling control device is configured to perform cooling in a time-division manner such that a cooling time of the second magnet is longer than a cooling time of the first magnet.

14. A magnetic resonance imaging system comprising:
a plurality of magnetic resonance imaging apparatuses each including a magnet configured to generate a static magnetic field;
a plurality of cooling systems equal to or less in number than the magnetic resonance imaging apparatuses and configured to cool the magnet; and
a cooling control device configured to switch a cooling target between the cooling systems and the magnetic resonance imaging apparatuses.

15. A magnetic resonance imaging apparatus comprising:
a first magnet configured to generate a static magnetic field;
a first cooling system configured to cool the first magnet; and
a cooling switch configured to couple the first cooling system and a second magnet of another magnetic resonance imaging apparatus and switch to cooling the second magnet by the first cooling system.

16. A magnetic resonance imaging apparatus comprising:
a first magnet configured to generate a static magnetic field;
a first cooling system configured to cool the first magnet; and
a cooling switch coupled to a second cooling system for cooling a second magnet of another magnetic resonance imaging apparatus and configured to switch to cooling the first magnet by the second cooling system.

17. A cooling control device configured to execute cooling control between a plurality of magnetic resonance imaging apparatuses and a plurality of cooling systems, the plurality of magnetic resonance imaging apparatuses each including a magnet configured to generate a static magnetic field, the plurality of cooling systems being equal to or less in number than the magnetic resonance imaging apparatuses and being configured to cool the magnet,
wherein the cooling control device is further configured to, when an anomaly occurs in a part of the cooling systems, switch a cooling target by switching coupling of a flow path between a cooling system that operates normally and the magnetic resonance imaging apparatuses.

18. A control method for a plurality of magnetic resonance imaging apparatuses each including a magnet configured to generate a static magnetic field, and a plurality of cooling systems equal to or less in number than the magnetic resonance imaging apparatuses and configured to cool the magnet, switching a cooling target by switching coupling of a flow path between a cooling system that operates normally and the magnetic resonance imaging apparatuses when an anomaly occurs in a part of the cooling systems.

* * * * *